United States Patent
Imai (10) Patent No.: US 6,472,938 B2
(45) Date of Patent: Oct. 29, 2002

(54) AUTOMATIC LEVEL CONTROLLING CIRCUIT

(75) Inventor: Katsumi Imai, Gunma (JP)

(73) Assignee: Sanyo Electric Co., Ltd., Osaka (JP)

(*) Notice: Subject to any disclaimer, the term of this patent is extended or adjusted under 35 U.S.C. 154(b) by 0 days.

(21) Appl. No.: 09/835,879

(22) Filed: Apr. 16, 2001

(65) Prior Publication Data

US 2002/0021172 A1 Feb. 21, 2002

(30) Foreign Application Priority Data

Apr. 17, 2000 (JP) .................................. 2000-115310

(51) Int. Cl.$^7$ ................................................ H03G 3/20
(52) U.S. Cl. ...................................... 330/140; 330/281
(58) Field of Search .......................... 330/140, 141, 330/281, 129

(56) References Cited

U.S. PATENT DOCUMENTS

| | | | | |
|---|---|---|---|---|
| 4,371,842 A | * | 2/1983 | Lee ............................ | 330/141 |
| 4,451,797 A | * | 5/1984 | Bains, Jr. .................... | 330/281 |
| 5,352,988 A | * | 10/1994 | Park, II ....................... | 330/141 |
| 5,408,197 A | * | 4/1995 | Miyake ....................... | 330/129 |
| 5,659,893 A | * | 8/1997 | Enoki et al. ................. | 330/129 |

* cited by examiner

Primary Examiner—Robert Pascal
Assistant Examiner—Khanh Van Nguyen
(74) Attorney, Agent, or Firm—Fish & Richardson P.C.

(57) ABSTRACT

In an automatic level controlling circuit, an output from a full-wave rectifying circuit 12 is supplied to a first and a second time constant circuit. The first time constant circuit includes a first amplifier 22 and a capacitor 15. The second time constant circuit includes a second amplifier 23 and the capacitor 15. The first amplifier 22 operates when the output V1 from the full-wave rectifying circuit 12 is larger than a DC level VDC. In this configuration, the attack times when an input signal is switched from no signal into a middle level signal and when the input signal is switched from the middle signal into a high level signal can be set at optimum values, respectively.

8 Claims, 6 Drawing Sheets

AUTOMATIC LEVEL CONTROLLING CIRCUIT

BACKGROUND OF THE INVENTION

1. Field of the Invention

This invention relates to an automatic level controlling (ALC) circuit for controlling an output signal to a stable level even when the level of an input signal such as an audio signal is high.

2. Description of the Related Art

Generally, sound in the external environment includes a faint sound and loud sound. In the processing of an audio input signal, since it is necessary to assure a wide dynamic range, when the level of the audio input signal is high, it was controlled to a stable level by an automatic level controlling circuit. In a digital video camera which has spread in recent years, making a low voltage operation has been attempted for reduction of power consumption. It has been demanded for the characteristic of the automatic level controlling circuit to be improved to assure a wide dynamic range.

Figure 4:
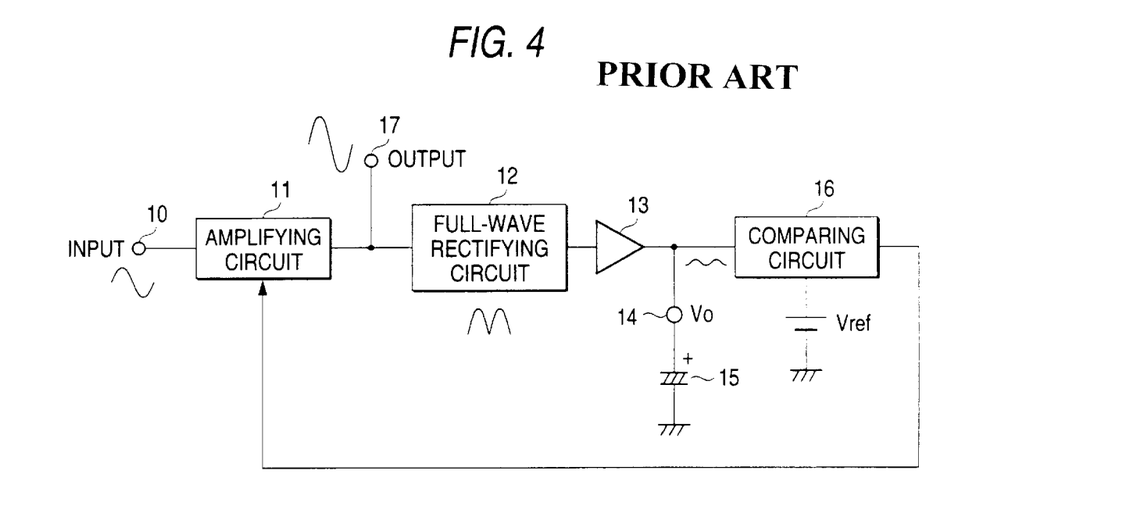
FIG. 4 is a circuit diagram of a conventional automatic level controlling circuit.

FIG. 4 is a circuit diagram of a conventional automatic level controlling circuit. In FIG. 4, reference numeral 10 denotes an input terminal to which an input signal is supplied; 11 an amplifying circuit for amplifying the input signal; 12 a full-wave rectifying circuit for full-wave rectifying an output from the amplifying circuit; 13 a buffer amplifier; and 14 a detecting terminal to which a capacitor 15 is externally attached. The full-wave rectifying circuit 12 and the capacitor 15 connected to the detecting terminal 14 constitute a detecting circuit. Reference numeral 16 denotes a comparing circuit for comparing a detected voltage Vo appearing at the detecting terminal 14 and a reference voltage Vref from a DC power source. The comparing circuit 16 produces a controlling voltage for controlling the gain of the amplifying circuit 11 according to a comparison result, thereby controlling the level of the output signal therefrom.

Figure 5:
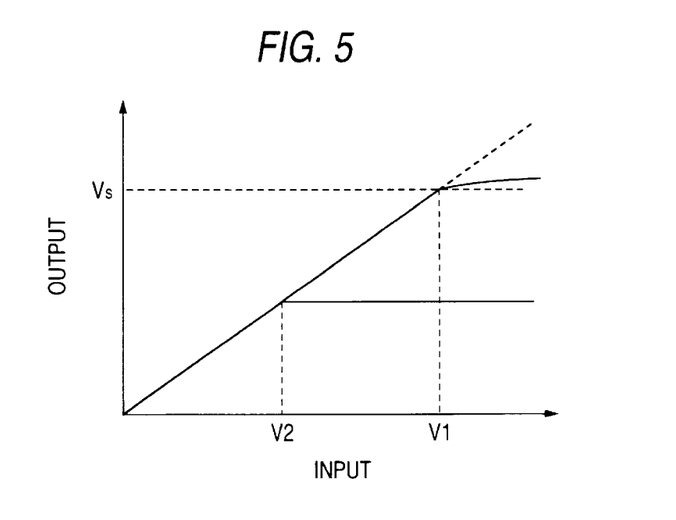
FIG. 5 is a graph showing an input/output characteristic in the conventional automatic level controlling circuit.

FIG. 5 is an input/output characteristic graph of the automatic level controlling circuit having the configuration described above. As seen from FIG. 5, in the absence of the automatic level controlling circuit, the output signal exceeds a saturated level Vs when the level of the input signal exceeds V1, and hence is clipped. On the other hand, in the presence of the automatic level controlling circuit, it restrains the level of the output signal when the level of the input signal reaches V2 so that clipping of the output signal can be prevented.

The characteristic of the automatic level controlling circuit is characterized by not only the above input/output characteristic but also the transient response characteristic when the level of the input signal has changed abruptly, i.e. attack/recovery characteristic.

Figure 6A:
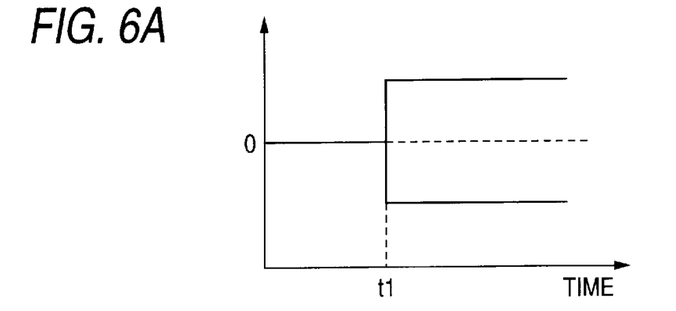
FIGS. 6A and 6B are waveform charts for explaining an attack characteristic.
Figure 6B:
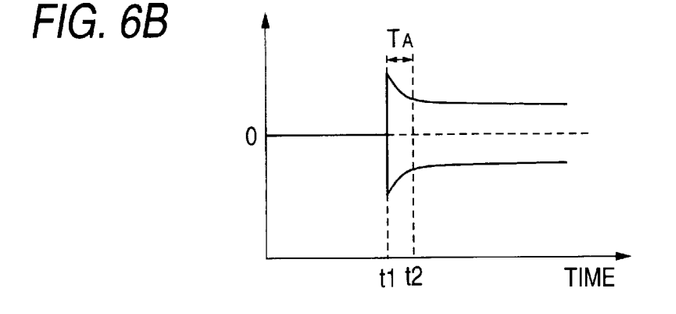

FIGS. 6A and 6B are waveform charts for explaining the attack characteristic. As seen from FIG. 6A, when the level of the input signal rises abruptly at a time t1, it is amplified instantaneously with a full gain. Then, as seen from FIG. 6B, the level of the output signal is clipped. However, the level is attenuated gradually through the automatic level controlling operation. In this case, the time taken to reach the stable level, or the time taken until the clipping of the level of the output signal is canceled is called "attack time $T_A$". The attack time is controlled by a CR time constant of the detecting circuit.

Figure 7A:
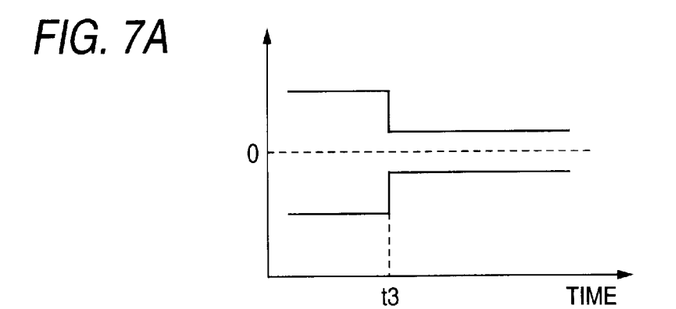
FIGS. 7A and 7B are waveform charts for explaining a recovery characteristic.
Figure 7B:
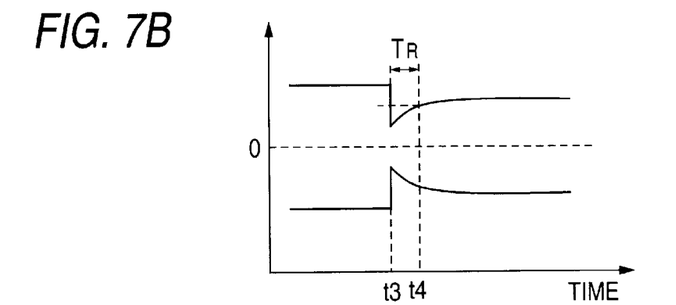

FIGS. 7A and 7B are waveform charts for explaining the recovery characteristic. As seen from FIG. 7A, it is assumed that the level of the input signal has decreased abruptly at time t3. Then, as seen from FIG. 7B, it takes a time for the level of the output signal to restore to the ordinary recovery time (t4). This time is called "recovery time $T_R$". In this case, a current flows through a discharging current path (not shown) so that the detected voltage Vo at the detecting terminal decreases.

Where the sensitivity of the automatic level controlling circuit is high (i.e. attack/recovery time is short), the distortion of the output signal increases. On the other hand, where the sensitivity is low (i.e. attack/recovery time is long), the output signal disappears for certain period. In this way, the performance of the automatic level controlling circuit is defined by various attack/recovery characteristics.

Figure 8:
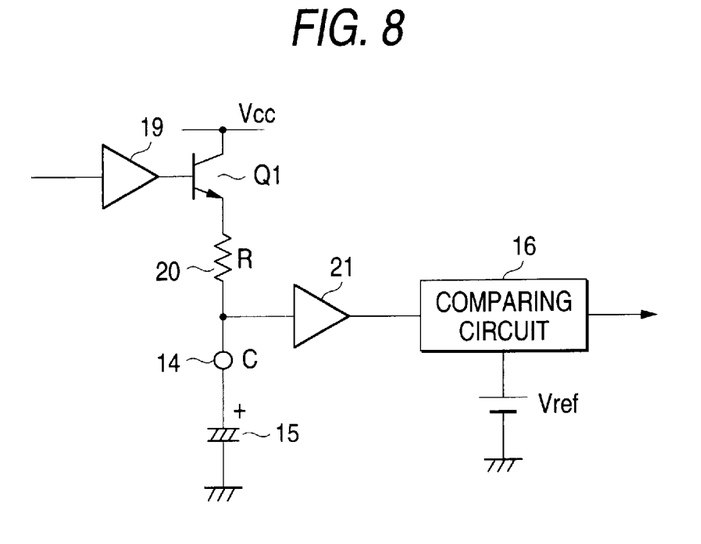
FIG. 8 is a circuit diagram for setting the attack time and recovery time.

FIG. 8 is a circuit diagram showing the circuit configuration for setting the attack time and recovery time of the automatic level controlling circuit. In FIG. 8, the output from the full-wave rectifying circuit 12 shown in FIG. 4 is applied to a buffer amplifier 19, and the output from the buffer amplifier 19 is applied to the base of an NPN-type transistor Q1. The one end of a resistor R is connected to the emitter of the NPN-type transistor Q1. The other end of the resistor R is connected to a detecting terminal 14. The detected voltage Vo which appears at the detecting terminal 14 is applied to a buffer amplifier 21. The output from the buffer amplifier 21 is applied to a comparing circuit 16.

Figure 9A:
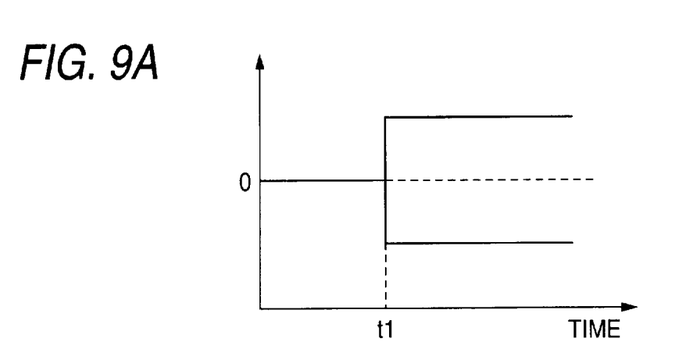
FIGS. 9A and 9B are waveform charts showing the attack characteristic when an input signal is switched from no signal into the middle input signal in the conventional automatic level controlling circuit.
Figure 9B:
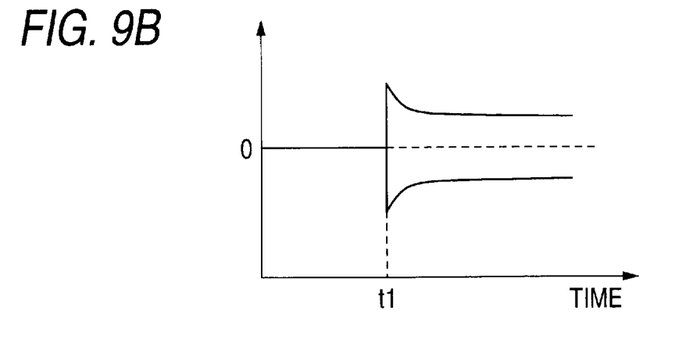

In the circuit configuration described above, the attack time is set by the charging time constant of the resistor R and capacitor 15. FIGS. 9A and 9B are waveform charts showing the attack characteristic when the input signal is switched from no signal into the signal in a middle level (hereinafter referred to as a middle input signal). The attack time is set at so short a time that as seen from FIG. 9A, when the input signal is switched from no signal into the middle input signal at time t1, as seen from FIG. 9B, the level of the output signal is converged instantaneously. In other words, the period while the level of the output signal is clipped is set at a short time.

Figure 10A:
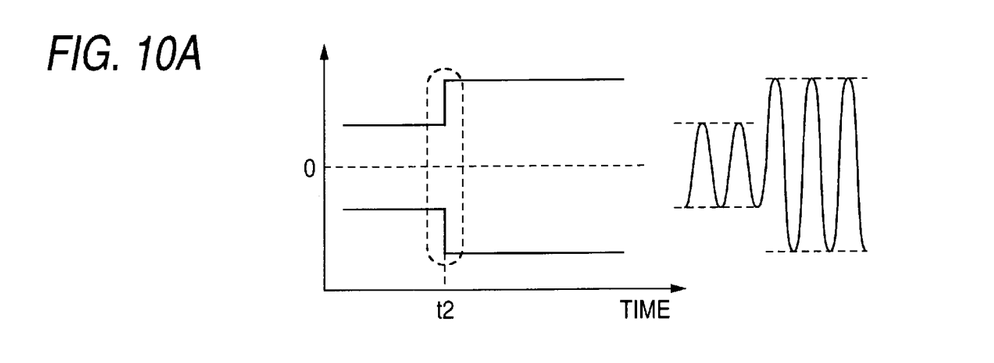
FIGS. 10A to 10C are waveform charts showing the attack characteristic when an input signal is switched from the middle input signal into a high input signal in the conventional automatic level controlling circuit.
Figure 10B:
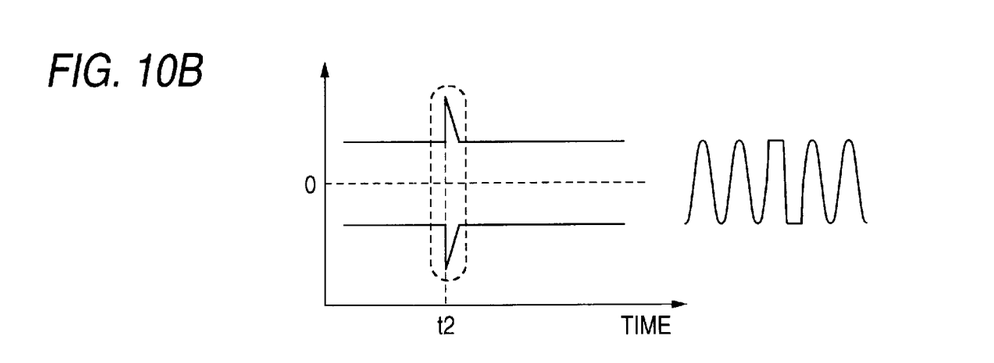
Figure 10C:
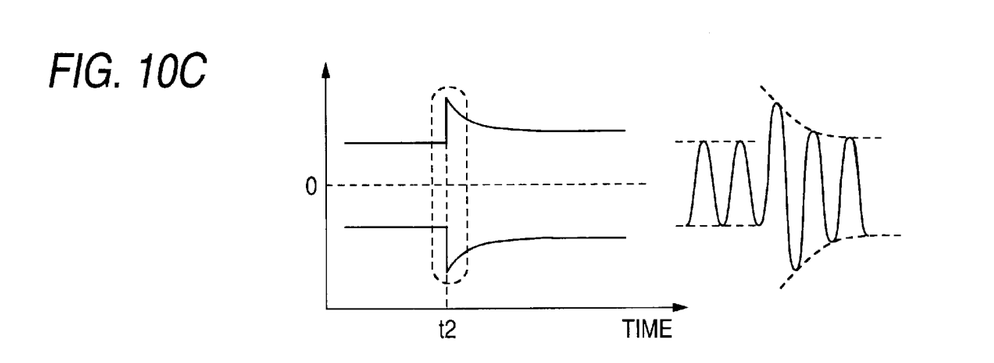

FIGS. 10A to 10C are graphs showing the attack characteristic when the input signal is switched from the middle input signal into an input signal in a high level (hereinafter referred to a high input signal). Now, as seen from FIG. 10A, it is assumed that the input signal has switched from the middle input signal into the high input signal at time t2. The waveform in the portion encircled by broken line is shown in an enlarged manner on the right side (also in FIGS. 10B and 10C). In this case, as seen from FIG. 10B, since the ability of limiting the signal level is too strong, the attack time becomes too short in the signal in which the switching between the middle input signal and the high input signal is to be repeated frequently. This gave rise to signal distortion. Particularly, in the case of a sound signal, the signal distortion led to an unpleasant phenomenon of "sound breakage".

In order to obviate such an inconvenience, with respect to the attack characteristic of switching the input signal from the middle input signal into the high input signal, the attack time must be set as shown in FIG. 10C so that slight distortion component remains instantaneously, but the output signal is thereafter limited gradually.

However, in the circuit configuration shown in FIG. 8, since the attack time is defined by the charging time constant of the resistor R and capacitor 15, that when the input signal is switched from the middle input signal into the high input signal could not set at a long time.

SUMMARY OF THE INVENTION

This invention has been accomplished in view of the inconvenience of the prior art described above.

An object of this invention is to provide an automatic level controlling circuit in which attack times when an input signal is switched from no signal into a middle input signal and when it is switched from the middle input signal into a high input signal can be set at optimum times, respectively, thereby solving the problem of "sound breakage" of a sound signal.

In order to attain the above object, in accordance with this invention, there is provided an automatic level controlling circuit for controlling an output from an amplifying circuit to a stable level when an input signal exceeding a prescribed level is received, comprising: a first and a second time constant circuit for setting an attack time for the automatic level controlling circuit; a comparing circuit for comparing output levels in the first and the second time constant circuit with a reference voltage; and an amplifying circuit for controlling an output signal level according to a control voltage produced from the comparing circuit, wherein the first time constant circuit has a smaller time constant than that of the second time constant and is operated according to a level of the input signal so that the attack time is variably set.

In this configuration, in the attack in the switching from no signal into a middle signal, the first time constant circuit having a small time constant operates so that the attack time is set. In this case, since the second time constant circuit has a large time constant, even when it operates, the attack time is substantially defined by the first time constant circuit.

On the other hand, in the attack in the switching from the middle signal into a high signal, the first time constant circuit is not operated so that a long attack time is set by the second time constant circuit having a large time constant. This permits the problem of sound breakage to be solved.

Preferably, the first and the second time constant circuit each includes a capacitor and a resistor for charging, and the capacitor is commonly used for the first and the second time constant circuit. Such a configuration permits the number of circuit elements to be reduced.

Preferably, the first time constant circuit includes: a differential amplifying circuit having a first differential transistor to which a prescribed DC level is applied and a second differential transistor to which an output from the amplifying circuit is applied; a first output transistor which is driven by an output from the differential amplifying circuit; a first output resistor connected to the first output transistor; and the capacitor connected to the first output resistor. In this arrangement, when an output level of the amplifying circuit is higher than the DC level, the capacitor is charged.

When the output from the amplifying circuit exceeds a prescribed DC level, the output transistor turns on according to the output from the differential amplifying circuit. Therefore, the attack time is set by the time constant defined by the first output resistor and capacitor.

Preferably, the second time constant circuit includes: a buffer amplifier; a second output transistor which is driven by the buffer amplifier; a second output resistor connected to the output transistor; and the capacitor connected to the second output resistor.

In this configuration, the second time constant circuit can be constructed which has a time constant defined by the second output resistor and capacitor and always operates irrespectively of the level of the input signal.

In a preferred embodiment, a composite impedance of the second output transistor and the second output resistor is larger than that of the first output transistor and the first output resistor.

In this configuration, the second time constant circuit always operates irrespectively of the level of the input signal and a composite impedance of the second output transistor and the second output resistor is larger than that of the first output transistor and the first output resistor. Therefore, when the first time constant circuit is operated according to the level of the input signal, the attack time is substantially set by the first time constant circuit. When the first time constant circuit does not operate, the attack time is set the time constant defined by the second output resistor and the capacitor in the second time constant circuit.

The above and other objects and features of this invention will be more apparent from the following description taken in conjunction with the accompanying drawings.

DESCRIPTION OF THE PREFERRED EMBODIMENTS

Figure 1:
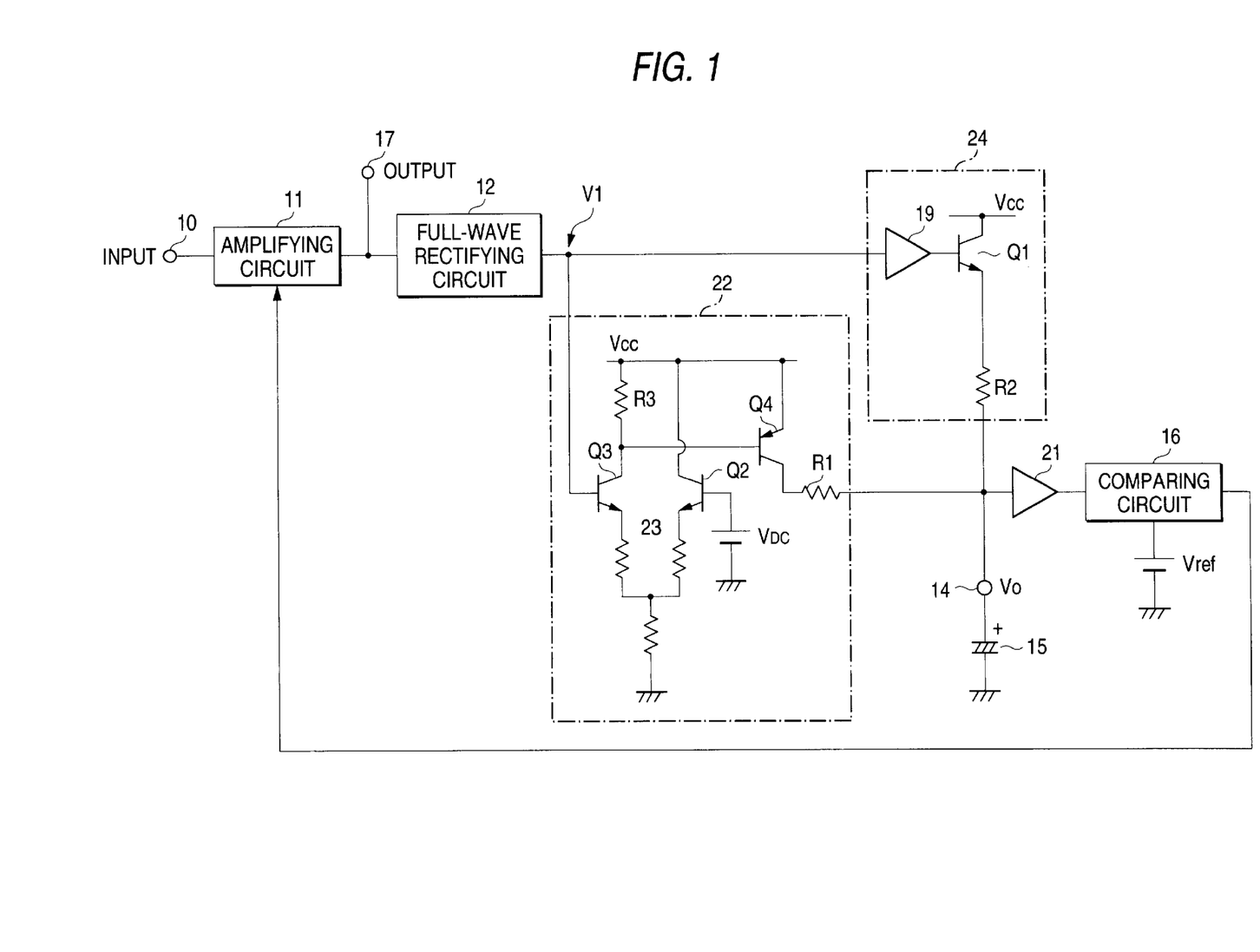
FIG. 1 is a circuit diagram of an automatic level controlling circuit according to an embodiment of this invention.

Now referring to the drawings, an explanation will be given of an embodiment of this invention. FIG. 1 is a circuit diagram of an automatic level controlling circuit according to an embodiment of this invention. In FIG. 1, reference numeral 10 denotes an input terminal. Numeral 11 denotes an amplifying circuit for amplifying an input signal, which includes a differential amplifier using a pair of differential transistors. As described later, the amplifying circuit 11 is adapted so that its gain can be controlled according to the control voltage produced from the comparing circuit 16. Numeral 12 denotes a full-wave rectifying circuit for full-wave rectifying the output from the amplifying circuit 11.

The output from the full-wave rectifying circuit 12 is supplied to a first and a second time constant circuit. The first time constant circuit is composed of a first amplifier 22 and a capacitor 15. The second time constant circuit is composed of a second amplifier 24 and the capacitor 15. Namely, the outputs from the first amplifier 22 and the second amplifier 24 are commonly connected to a detecting terminal 14. The capacitor 15 is connected to the detecting terminal 14 and also commonly included in the first and the second time constant circuit.

The first amplifier 22 includes a differential amplifying circuit 23, an PNP-type output transistor Q4 which is driven by the output from the differential amplifying circuit 23, and a first output resistor R1 connected to the output transistor Q4. The differential amplifying circuit 23 is composed of an NPN-type differential transistor Q2 with a base to which a DC level VDC from a reference power source is applied and another NPN-type differential transistor Q3 with a base to which the output from the full-wave rectifying circuit 12 is applied.

The collector of the differential transistor Q3 is connected to a power source Vcc through a resistor R3. The collector of the differential transistor Q3 (i.e. output from the differential amplifying circuit 23) is also connected to the base of the output transistor Q4. The first amplifier 22 serves to charge the capacitor 15 when the output level from the full-wave rectifying circuit 12 is higher than the DC level VDC.

The second amplifier 24 includes a buffer amplifier 19, an NPN-type output transistor Q1 which is driven by the buffer amplifier 19, and a second output resistor R2 connected to the output transistor Q1. Now it should be noted that the composite impedance of the output transistor Q4 and the second output resistor R2 is set at a larger value than that of the output transistor Q4 and the first output resistor R1. In other words, the output impedance of the second amplifier 24 is larger than that of the first amplifier 22.

The detected voltage Vo appearing at the detecting terminal 14 is applied to the comparing circuit 16 through a buffer amplifier 21. The comparing circuit 16 compares the detected voltage Vo with a reference voltage Vref from a DC power source to produce a control voltage according to the comparison result. The comparing circuit 16, as well known, includes a first differential transistor with a base to which the reference voltage is applied and a second differential transistor with a base to which the detected voltage Vo is applied. A pair of control voltages are produced from the collectors of the first and the second differential transistor (not shown). In such a configuration, when the detected voltage Vo becomes larger than the reference voltage Vref, the gain of the amplifying circuit 11 is regulated by the control voltages so that the level of the output signal at the output terminal 17 is limited to a prescribed level.

Figure 2:
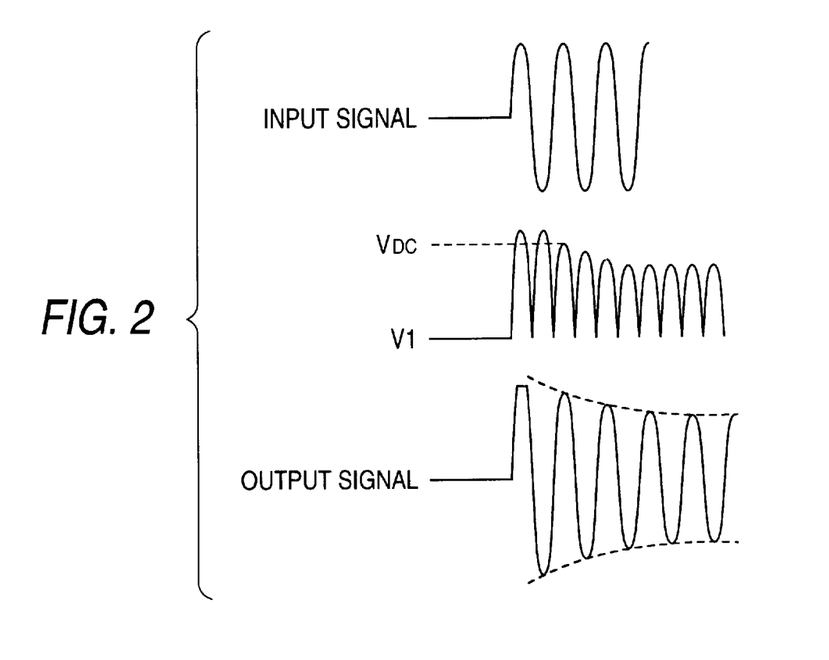
FIG. 2 is a waveform chart showing an attack characteristic when an input signal is switched from no signal into a middle input signal in an automatic level controlling circuit according to the embodiment of this invention.
Figure 3:
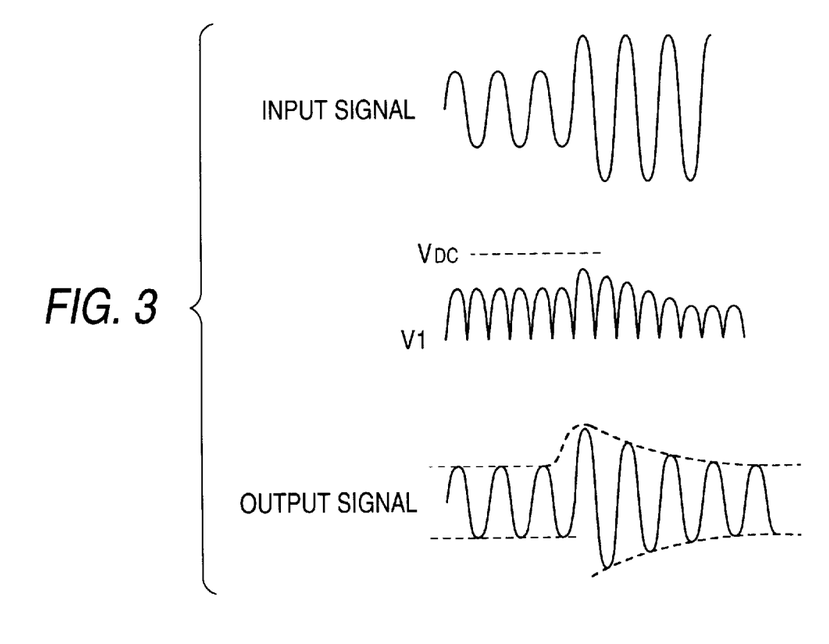
FIG. 3 is a waveform chart showing an attack characteristic when an input signal is switched from the middle input signal into a high input signal in an automatic level controlling circuit according to the embodiment of this invention.

Referring to FIGS. 1 to 3, a detailed explanation will be given of the attacking operation in the automatic level controlling circuit having the configuration described above.

FIG. 2 is a view showing the attack characteristic when the input signal is switched from no signal into the middle input signal. FIG. 3 is a view showing the attack characteristic when the input signal is switched from the middle input signal into the high input signal.

Now, as shown in FIG. 2, it is assumed that the input signal at the input terminal 10 has been switched from no signal into the middle input signal. The output V1 from the full-wave rectifying circuit 12, which is acquired by full-wave rectifying the output from the amplifying circuit 11, is raised to a higher level than the grounding level (0 V). Now, the DC level is set at a lower level than the output V1 immediately after the input signal has been switched. In this case, the differential transistor Q3 in the differential amplifying circuit 23 turns on whereas the differential transistor Q2 turns off. When the differential transistor Q3 turns on, a current flows into the differential transistor Q3 from the power source Vcc via the resistor R3. Then, the collector potential of the differential transistor Q3 falls and the base potential of the output transistor Q4 also falls.

Thus, the output transistor Q4 turns on so that the capacitor 15 is charged through the current path via the first output resistor R1. At this time, the output transistor Q1 also operates and a current flow through the current path via the second output resistor R2 so that the capacitor 15 can be charged. However, since the composite impedance of the output transistor Q1 and the second output resistor R2 is larger than that of the output transistor Q4 and the first output resistor R1, the charging current due to the former can be decreased.

As a result, the attack time in this case can be substantially set at a prescribed value by the time constant based on the output transistor Q4, first resistor R1 and capacitor 15. The output signal at the output terminal 17 under such a setting of the attack time is amplified at a full gain by the amplifying circuit 11 so that it is clipped for an instant but swiftly limited to the normal level.

Next, as shown in FIG. 3, it is assumed that the input signal at the input terminal 10 has been switched from the middle level signal into the high signal. In this case, the attack from no signal into the middle signal has passed so that the level of the output signal has been stable. A change in the output signal is smaller than in the case of the attack from no signal to the middle signal.

For this reason, the output V1 can be set to be smaller than the DC level VDC. Specifically, the DC level VDC is set smaller than the output V1 when the input signal is switched from no signal into the middle signal, whereas it is larger than the output V1 when the input signal is switched from the middle level into the high signal.

Thus, in the attack when the input signal has been switched from the middle signal into the high signal, the differential transistor Q3 of the differential amplifying circuit 23 turns off so that the output transistor Q4 also turns off. Namely, the first amplifying circuit 22 (first time constant circuit) does not operate. On the other hand, the output transistor Q1 of the second amplifying circuit 24 operates so that a current flows through the current path via the second output resistor R2, thereby charging the capacitor 15.

Now, since the composite impedance of the output transistor Q1 and the second output resistor R2 is larger than that of the output transistor Q4 and the first output resistor R1, a long attack time can be set due to its large time constant. Therefore, when the input signal is switched, the output signal is limited gradually with no large signal distortion. This permits the sound breakage to be relaxed.

In accordance with this invention, in the automatic level controlling circuit, in the attack in the switching from no signal into the middle signal, the first time constant circuit having a small time constant operates so that a prescribed attack time is set. On the other hand, in the attack in the switching from the middle signal into the high signal, the first time constant is not operated so that an appropriate long attack time is set by the second time constant circuit having a large time constant. This contributes to solve the problem of "sound breakage".

What is claimed is:

1. An automatic level controlling circuit for controlling an output from an amplifying circuit to a stable level when an input signal exceeding a prescribed level is received, comprising:

first and second time constant circuits for setting an attack time for said automatic level controlling circuit;

a comparing circuit for comparing an output from said first and said second time constant circuits or from said second time constant circuit alone with a reference voltage; and an amplifying circuit for controlling an output signal level according to a control voltage produced from said comparing circuit, wherein said first time constant circuit has a smaller time constant than that of said second time constant and is activated when an output of said amplifying circuit is larger than a predetermined level to vary the attack time.

2. An automatic level controlling circuit according to claim 1, wherein said first and said second time constant circuits each includes a capacitor and a resistor for charging, and said capacitor is commonly used for said first and said second time constant circuit.

3. An automatic level controlling circuit according to claim 1, wherein said first time constant circuit includes:

a differential amplifying circuit having a first differential transistor to which a prescribed DC level is applied and a second differential transistor to which an output from said amplifying circuit is applied;

a first output transistor which is driven by an output from said differential amplifying circuit;

a first output resistor connected to said first output transistor; and a capacitor connected to said first output resistor, wherein when an output level of said amplifying circuit is higher than said DC level, said capacitor is charged.

4. An automatic level controlling circuit according to claim 3, wherein said second time constant circuit includes:

a buffer amplifier;

a second output transistor which is driven by said buffer amplifier;

a second output resistor connected to said output transistor; and said capacitor connected to said second output resistor.

5. An automatic level controlling circuit according to claim 4, wherein a composite impedance of said second output transistor and said second output resistor is larger than that of said first output transistor and said first output resistor.

6. An automatic level controlling circuit comprising:

an amplifying circuit for amplifying an input signal to produce an amplified output;

a full-wave rectifying circuit for full-wave rectifying the amplified output from said amplifying circuit;

a first and a second amplifiers to which an output from said full-wave rectifying circuit is applied;

a capacitor which is charged when an output from said first or said second amplifier is supplied; and a comparing circuit for comparing a detected voltage charged in said capacitor with a reference voltage to produce a control voltage for regulating an output level from said amplifying circuit, wherein said first amplifier has a smaller output impedance than that of said second amplifier and is operated according to an input signal level so that an attack time is variably set.

7. An automatic level controlling circuit according to claim 6, wherein said first amplifier includes: a differential amplifying circuit having a first differential transistor to which a prescribed DC level is applied and a second differential transistor to which an output from said amplifying circuit is applied;

a first output transistor which is driven by an output from said differential amplifying circuit;

a first output resistor connected to said first output transistor; and said capacitor connected to said first output resistor, wherein when an output level of said full-wave rectifying circuit is higher than said DC level, said capacitor is charged.

8. An automatic level controlling circuit according to claim 7, wherein said second amplifier includes:

a buffer amplifier;

a second output transistor which is driven by said buffer amplifier; and a second output resistor connected to said output transistor, wherein a composite impedance of said second output transistor and said second output resistor is larger than that of said first output transistor and said first output resistor.

* * * * *